(12) United States Patent
Tamura (10) Patent No.: US 7,683,624 B2
(45) Date of Patent: Mar. 23, 2010

(54) MAGNETIC FIELD ADJUSTMENT DEVICE AND MAGNETIC FIELD ADJUSTMENT METHOD FOR SUPERCONDUCTING MAGNET

(75) Inventor: Hajime Tamura, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 11/907,758

(22) Filed: Oct. 17, 2007

(65) Prior Publication Data

US 2008/0290871 A1 Nov. 27, 2008

(30) Foreign Application Priority Data

May 25, 2007 (JP) ............................. 2007-139024

(51) Int. Cl.
*G01V 3/00* (2006.01)
(52) U.S. Cl. ..................................... 324/320
(58) Field of Classification Search ......... 324/300–322; 335/296–306
See application file for complete search history.

(56) References Cited

U.S. PATENT DOCUMENTS

| | | | | |
|---|---|---|---|---|
| 5,635,839 A * | 6/1997 | Srivastava et al. | ............ | 324/320 |
| 5,786,695 A * | 7/1998 | Amor et al. | ................ | 324/320 |
| 5,923,235 A * | 7/1999 | Van Oort | ..................... | 335/301 |
| 6,255,928 B1 * | 7/2001 | van Oort et al. | ............. | 335/301 |
| 6,566,991 B1 * | 5/2003 | Rimkunas et al. | ........... | 335/301 |
| 6,714,109 B1 * | 3/2004 | Rimkunas et al. | ........... | 335/301 |
| 6,778,054 B1 * | 8/2004 | Huang et al. | ................. | 335/301 |
| 6,798,205 B2 * | 9/2004 | Bommel et al. | ............. | 324/319 |
| 6,819,107 B2 * | 11/2004 | Heid | ........................... | 324/318 |
| 6,822,453 B2 * | 11/2004 | Boemmel et al. | ........... | 324/320 |
| 6,861,933 B1 * | 3/2005 | Yoshida et al. | .............. | 335/301 |
| 6,984,982 B2 * | 1/2006 | Huang et al. | ................. | 324/318 |
| 7,375,518 B2 * | 5/2008 | Kurome et al. | .............. | 324/307 |
| 2003/0011456 A1 | 1/2003 | Yoshida et al. | | |
| 2003/0214300 A1 | 11/2003 | Bommel et al. | | |
| 2004/0051613 A1 | 3/2004 | Yoshida et al. | | |

FOREIGN PATENT DOCUMENTS

| | | |
|---|---|---|
| JP | 63-122441 | 5/1988 |
| JP | 1-254154 A | 10/1989 |
| JP | 5-220127 A | 8/1993 |
| WO | WO 2004/106960 A1 | 12/2004 |

\* cited by examiner

*Primary Examiner*—Brij B Shrivastav
*Assistant Examiner*—Dixomara Vargas
(74) *Attorney, Agent, or Firm*—Buchanan Ingersoll & Rooney PC

(57) ABSTRACT

A magnetic field adjustment device for a superconducting magnet, wherein magnetic material shim mechanisms are arranged in an axial direction of an inside periphery of the cylindrical superconducting magnet, each of the magnetic material shim mechanisms including a combined shim tray (14 in FIG. 2) in which a plurality of divided shim trays (11 and 12) and shim tray spacers (13) inserted between the divided shim trays are rectilinearly coupled, and magnetic material shims (101) for magnetic field adjustments as are accommodated in the divided shim trays. The magnetic material shim mechanisms afford a high versatility of magnetic material shim arrangements, whereby a correctable range of a magnetic field uniformity can be widened.

8 Claims, 8 Drawing Sheets

| COMPUTED RESULTS OF MAGNETIC MATERIAL SHIM ARRANGEMENTS |

| SHIM TRAY A | 1A | 2A | 3A | 4A | 5A | 6A | 7A | 8A | 9A | 10A |
|---|---|---|---|---|---|---|---|---|---|---|
| SHIM THICKNESS (mm) | 10 | 8 | 0 | 0 | 6 | 0 | 0 | 0 | 0 | 1 |

| SHIM TRAY B | 1B | 2B | 3B | 4B | 5B | 6B | 7B | 8B | 9B |
|---|---|---|---|---|---|---|---|---|---|
| SHIM THICKNESS (mm) | 0 | 0 | 2 | 0 | 0 | 4 | 3 | 2 | 0 |

| COMPUTED RESULT OF (SHIM TRAY COMBINATION + MAGNETIC MATERIAL SHIM ARRANGEMENT) |

| SHIM TRAY | 1A | 2A | SP | 3B | SP | 5A | SP | 6B | 7B | 8B | SP | 10A |
|---|---|---|---|---|---|---|---|---|---|---|---|---|
| SHIM THICKNESS (mm) | 10 | 8 |  | 2 |  | 6 |  | 4 | 3 | 2 |  | 1 |

※ SP ⋯ SPACER

CONVENTIONAL ART

FIG. 14

CONVENTIONAL ART

FIG. 15

MAGNETIC FIELD ADJUSTMENT DEVICE AND MAGNETIC FIELD ADJUSTMENT METHOD FOR SUPERCONDUCTING MAGNET

BACKGROUND OF THE INVENTION

1. Field of the Invention

This invention relates to a magnetic field adjustment device and a magnetic field adjustment method for a superconducting magnet as are chiefly employed for a magnetic resonance imaging equipment (hereinbelow, abbreviated to "MRI equipment").

2. Description of the Related Art

In an MRI equipment, a static magnetic field which has a high magnetic field strength and which is of high spatial uniformity and high temporal stability is needed, and hence, a superconducting magnet is often employed.

It is required of the superconducting magnet for the MRI equipment to generate a magnetic field region which exhibits a very high uniformity of, for example, within 3 ppm, near a magnetic field center. Therefore, the superconducting magnet is designed at a high precision. In actuality, however, a magnetic field uniformity in an actual diagnostic space worsens due to a manufacturing dimensional error in a process for producing the magnet, the influence of a magnetic material existing around a place where the magnet is installed, and so forth.

Therefore, the superconducting magnet includes means for making the fine adjustment (hereinbelow, termed "shimming") of a magnetic field. There is a passive shimming method in which magnetic material shims made of a magnetic material of high permeability are used as one means for performing the shimming. This method is such that the magnetic material shims in an appropriate quantity are arranged at an appropriate position, within the generated magnetic field of the superconducting magnet, and that the disorder of the highly uniform magnetic field of the superconducting magnet is corrected by utilizing a magnetic field generated by the magnetization of the magnetic material shims. (Refer to Patent Document 1 being JP-A-1-245154, and Patent Document 2 being JP-A-63-122441.)

Figure 13:
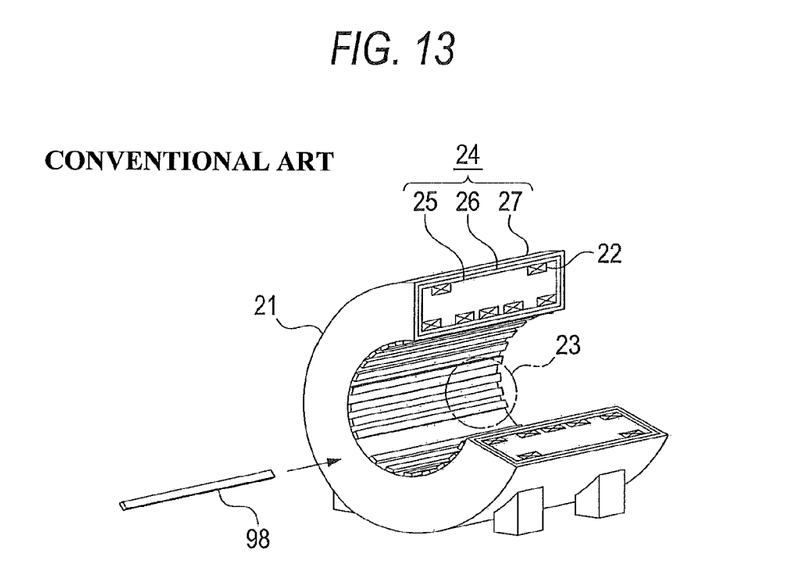
FIG. 13 is a perspective view of a magnetic material shim mechanism in the prior art.

The shimming based on a prior-art passive shimming method will be described with reference to FIGS. 13 and 14. FIG. 13 is a cut-away perspective view of a superconducting magnet for an MRI equipment as includes a prior-art magnetic field adjustment device. Referring to FIG. 13, numeral 21 designates the superconducting magnet which has a substantially cylindrical shape. Inside the superconducting magnet 21, a plurality of superconducting coils 22 are disposed substantially concentrically with the cylinder of the superconducting magnet 21, and they generate a static magnetic field in a uniform magnetic field space 23 to which a highly uniform magnetic field is to be outputted. The superconducting coils 22 are coils each of which is fabricated by winding a superconducting wire, and they are accommodated in a low-temperature container 24, together with liquid helium (not shown) which is a coolant required for holding these superconducting coils 22 in a superconducting state. The low-temperature container 24 is configured of a helium tank 25 in which the liquid helium and the superconducting coils are accommodated, a thermal shield 26 which serves to intercept thermal invasion from outside, and a vacuum tank 27 which holds the interior of this low-temperature container 24 in a vacuum state. Usually, a refrigerator (not shown) is connected to the low-temperature container 24 in order to suppress the consumption of the liquid helium.

Numeral 98 designates a magnetic material shim mechanism, which is fixed to the inside cylinder of the superconducting magnet 21. The magnetic material shim mechanism 98 is a mechanism for accommodating magnetic material shims therein so as to arrange them at the periphery of the uniform magnetic field space 23.

Figure 14:
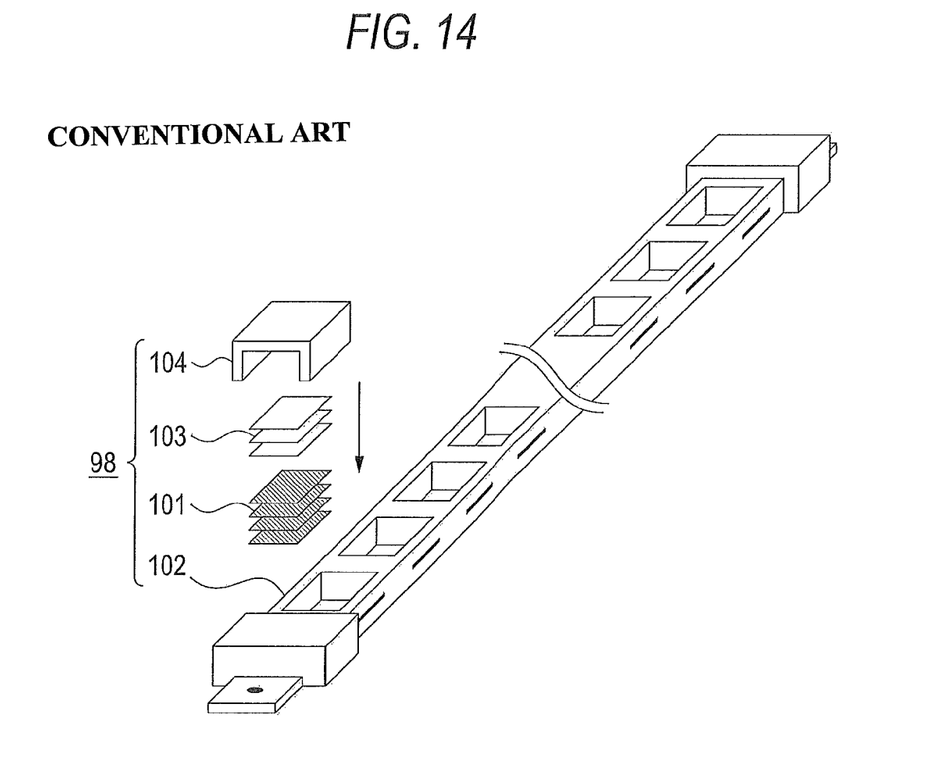
FIG. 14 is a perspective view of a superconducting magnet in which the prior-art magnetic material shim mechanism is assembled.

FIG. 14 shows the magnetic material shim mechanism 98. The magnetic material shim mechanism 98 is configured of the plurality of magnetic material shims 101, a shim tray 102 which accommodates the magnetic material shims 101 therein and which is fixed to the inside cylinder of the superconducting magnet 21, and shim spacers 103 and lids 104 which fix the magnetic material shims 101 within shim pockets. The shim tray 102 is formed of a nonmagnetic material, and it has a shim pocket structure for arranging the magnetic material shims 101 therein.

The magnetic material shims 101 are thin plates made of a magnetic material, for example, iron, and they have predetermined vertical and lateral dimensions so as to be accommodated in shim pockets. As the magnetic material shims 101, a plurality of sorts having different thicknesses are prepared. The quantity of the magnetic material which is arranged in each shim pocket is determined by the thicknesses and number of the magnetic material shims 101.

The shim tray 102 is formed with slits so that the lids 104 of snug fit type can be fixed. After the accommodation of the magnetic material shim 101 in the shim pocket, the shim spacers 103 made of a nonmagnetic material are packed into the shim pocket, and the lid 104 made of a nonmagnetic material is put on the shim pocket, whereby the magnetic material shims 101 are fixed within the shim pocket. The shim tray 102 has a mechanism for being fixed to the inside cylinder of the superconducting magnet 21, and it is fixed to the inside cylinder of the superconducting magnet 21 after the accommodation of the magnetic material shims 101. In this way, the magnetic material shims 101 are arranged on the magnet inside cylinder so as to correct the disorder of the magnetic field uniformity. The magnetic material shim mechanisms sometimes form part of the structure of inclined magnetic field coils in the MRI equipment.

The shimming which uses the magnetic material shim mechanisms is carried out by the following steps:

Initially, the superconducting magnet 21 is excited in a state where the magnetic material shims 101 are not mounted, and the magnetic fields of the uniform magnetic field space 23 are measured at a large number of points, so as to evaluate the uniformity of the magnetic field which the superconducting magnet 21 generates. In general, magnetic field strengths in a uniform magnetic field region are expressed as Formula (1) by employing a Legendre function expansion, and they are nominated by components based on (m, n) values. A (0, 0) component is a necessary uniform magnetic field component, and all the others are error magnetic field components which are nonuniform within the imaging region.

Subsequently, the arrangement of the magnetic material is designed in order to correct the nonuniformity of the magnetic field. The design is performed by a computation which optimizes the quantities of the magnetic material as is to be arranged in the respective shim pockets, so as to lessen the error magnetic field components to the utmost, on the basis of the measured magnetic fields at the large number of points. The result of the computation is outputted as a table in which the numbers of the magnetic material shims 101 to be attached into the respective shim pockets are listed. An operator attaches the magnetic material shims 101 on the basis of the table. When the attachment of the magnetic material shims 101 has been completed, the superconducting magnet 21 is excited and the magnetic fields of the uniform magnetic field space 21 are measured again, so as to reevaluate the uniformity of the generated magnetic field after the magnetic material shim correction.

Figure 15:
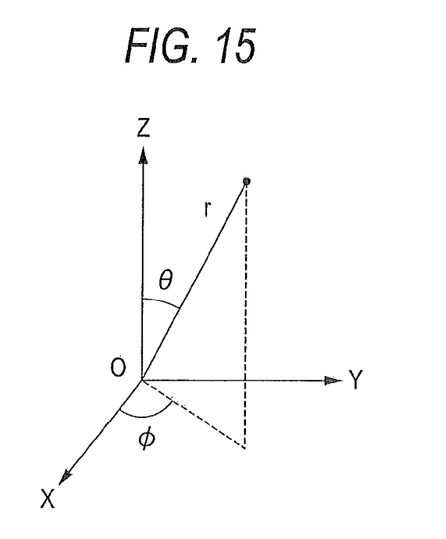
FIG. 15 is a diagram for explaining a coordinate system in Formula (1).

Usually, it is difficult to bring the magnetic field uniformity into a target value by one time of execution. Therefore, the operations as stated above are repeated several times, whereby the magnetic field uniformity is gradually enhanced.

$$B_z(r, \theta, \phi) = \sum_{m=0}^{\infty} \sum_{m=0}^{n} r^n P_n^m(\cos\theta)\{A_n^m \cos(m\phi) + B_n^m \sin(m\phi)\} \quad (1)$$

where:

$B_z$ denotes a magnetic field at coordinates $(r, \theta, \phi)$, the coordinates $(r, \theta, \phi)$ are indicated in FIG. 15, and $A_n^m$ and $P_n^m$ denote those coefficients of respective components which are determined depending upon a magnetic field shape.

With the prior-art magnetic material shim mechanism as stated above, the shim tray is a unitary molded article. Accordingly, there has been the problem that the positions of the magnetic material shims cannot be finely adjusted, and that the versatility of the magnetic material shim arrangements is low. Therefore, in a case where the uniformity of the magnetic field (hereinbelow, termed "rough magnetic field") generated by the superconducting magnet itself is inferior, it has been sometimes impossible to make the uniformity correction by the prior-art magnetic material shim mechanisms. Besides, the shim tray designed optimally for the rough magnetic field characteristic of a specified superconducting magnet type cannot be diverted to the uniformity adjustment of a superconducting magnet type having another rough magnetic field characteristic. It has accordingly been necessary to design the optimal shim tray every superconducting magnet type.

SUMMARY OF THE INVENTION

This invention has been made in order to solve the problems as stated above, and it has for its object to provide a magnetic field adjustment device and a magnetic field adjustment method for a superconducting magnet as adopt magnetic material shim mechanisms affording a high versatility of magnetic material shim arrangements, whereby the correctable range of a magnetic field uniformity can be widened.

A magnetic field adjustment device according to this invention is a magnetic field adjustment device for a superconducting magnet, wherein magnetic material shim mechanisms are arranged in an axial direction of an inside periphery of the cylindrical superconducting magnet. Each of the magnetic material shim mechanisms includes a combined shim tray in which a plurality of divided shim trays divided in the axial direction, and at least one shim tray spacer inserted between the divided shim trays are rectilinearly coupled, and magnetic material shims for magnetic field adjustments as are accommodated in the divided shim trays.

Besides, a magnetic field adjustment method according to this invention is a magnetic field adjustment method for a superconducting magnet, wherein magnetic material shim mechanisms are arranged in an axial direction of an inside periphery of the cylindrical superconducting magnet. The magnetic field adjustment method includes the steps of preparing as each of the magnetic material shim mechanisms, a combined shim tray in which a plurality of divided shim trays for accommodating magnetic material shims for magnetic field adjustments therein, and shim tray spacers inserted between the divided shim trays are rectilinearly coupled, and simultaneously optimizing how to combine the divided shim trays and the shim tray spacers, and mounting quantities of the magnetic material shims, thereby to determine arrangements of the magnetic material shims.

According to this invention, the versatility of the positions of the magnetic material shims is heightened, whereby the correctable range of a magnetic field uniformity based on a passive shimming method can be widened.

Thus, the magnetic field uniformity can be heightened by magnetic material shim corrections, even for the magnet whose working precision is inferior and whose manufacturing dimensional errors are large, and the magnetic field uniformity can be heightened more, for the magnet whose working precision is high and whose rough field is highly uniform.

Besides, magnetic field uniformities can be adjusted using the same magnetic material shim mechanisms, for a plurality of types of magnets which exhibit different rough magnetic field characteristics.

The foregoing and other objects, features, aspects and advantages of this invention will become more apparent from the following detailed description of this invention when taken in conjunction with the accompanying drawings.

DESCRIPTION OF THE PREFERRED EMBODIMENTS

Embodiment 1

Now, Embodiment 1 of this invention will be concretely described with reference to the drawings.

Figure 1:
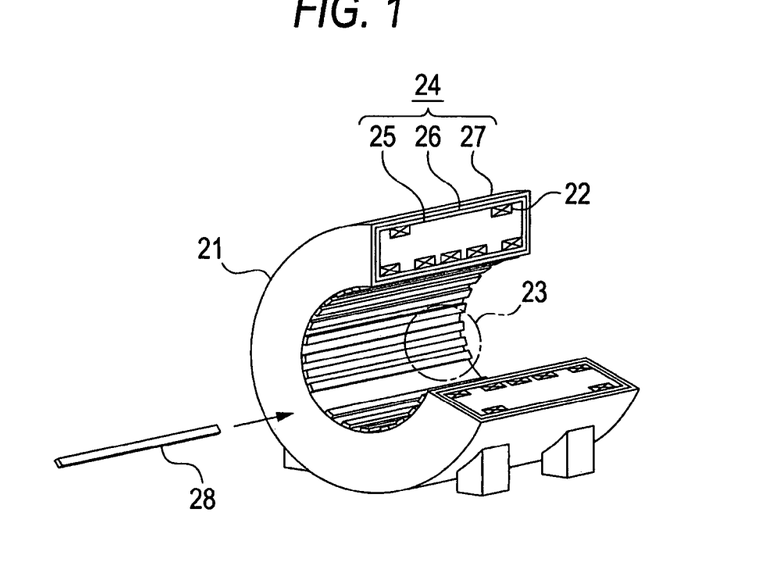
FIG. 1 is a perspective view of a superconducting magnet in which magnetic material shim mechanisms in this invention are assembled.
Figure 2:
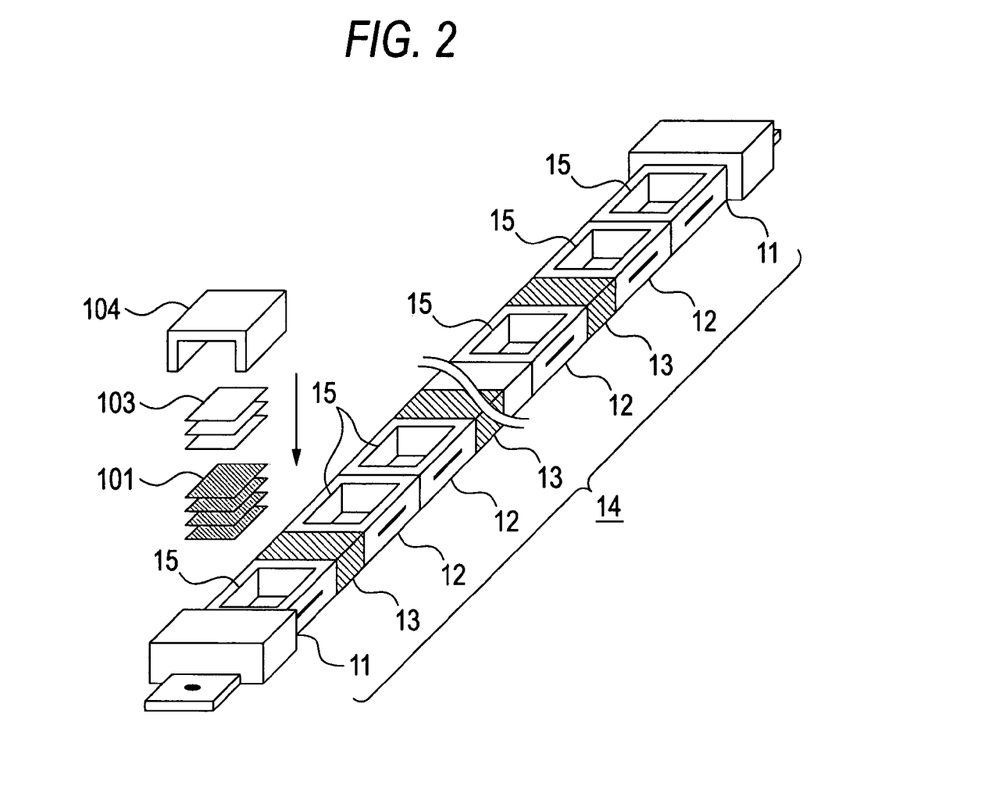
FIG. 2 is a perspective view of the magnetic material shim mechanism in Embodiment 1 of this invention.

FIG. 1 is a cut-away perspective view showing a magnetic field adjustment device for a superconducting magnet according to Embodiment 1 of this invention, while FIG. 2 is a perspective view of a magnetic material shim mechanism which is used in the magnetic field adjustment device for the superconducting magnet in Embodiment 1.

Referring to FIG. 1, inside the superconducting magnet 21 having a substantially cylindrical shape, a plurality of superconducting coils 22 are disposed substantially concentrically with the cylinder of the superconducting magnet 21, they output a static magnetic field to a uniform magnetic field space 23 to which a highly uniform magnetic field is to be outputted, and they suppress an external leakage magnetic field. The superconducting coils 22 are coils each of which is fabricated by winding a superconducting wire material that contains, for example, niobium titanate (NbTi) as a superconductor. These superconducting coils 22 are accommodated in a low-temperature container 24, together with liquid helium (not shown) which is a coolant necessary for holding them in a superconducting state. The low-temperature container 24 is configured of a helium tank 25 which accommodates the liquid helium and the superconducting coils therein, a thermal shield 26 which serves to intercept thermal invasion from outside, and a vacuum tank 27 which holds the interior of the low-temperature container 24 in a vacuum state. Although not shown, a refrigerator is connected to the low-temperature container 24 in order to suppress the consumption of the liquid helium.

Magnetic material shim mechanisms 28 for correcting the disorder of the highly uniform magnetic field are arranged in the axial direction of the inside periphery of the superconducting magnet 21. The magnetic material shim mechanisms 28 are installed on the cylindrical portion of the superconducting magnet 21 at equal intervals in the number of, for example, 24.

As shown in FIG. 2, each magnetic material shim mechanism 28 is such that magnetic material shims 101 and shim spacers 103 are accommodated in the shim pockets 15 of a combined shim tray 14 which is configured by rectilinearly coupling divided shim trays for end parts, 11, a plurality of divided shim trays 12, and a plurality of shim tray spacers 13, and that lids 104 are put on the shim pockets 15. Among the constituents of each magnetic material shim mechanism 28, the others than the magnetic material shims 101 are fabricated of a nonmagnetic material such as resin.

Figure 3:
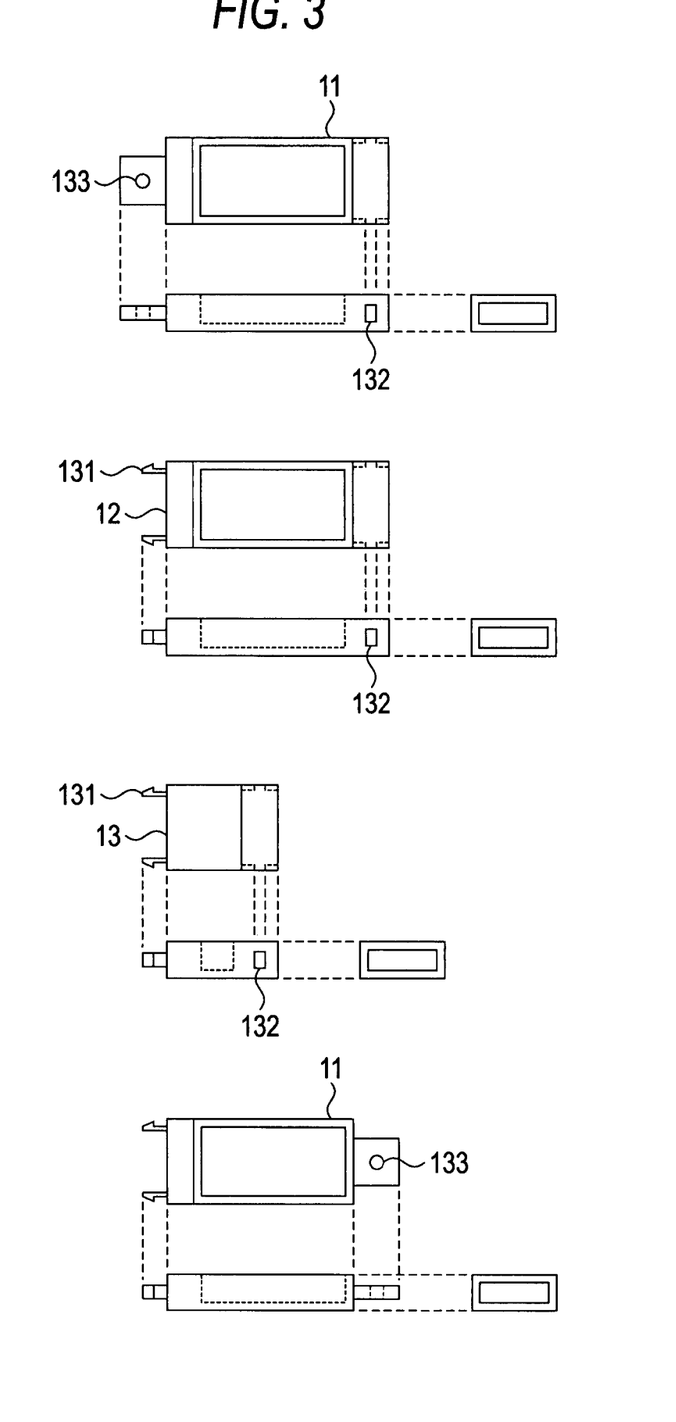
FIG. 3 is a view showing the plans, sides and fronts of divided shim trays for end parts, a divided shim tray and a shim tray spacer which constitute the magnetic material shim mechanism in Embodiment 1 of this invention.

The divided shim trays for the end parts, 11, the divided shim tray 12 and the shim tray spacer 13 are shown in FIG. 3. Each of the divided shim tray 12 and the shim tray spacer 13 is provided with fitting pawls 131 at one end and fitting holes 132 at the other end. The end at which the fitting holes 132 are open, is hollow. In assembling the divided shim tray 12 and the shim tray spacer 13, the end (left side in the figure) on the side of the fitting pawls 131 is inserted into the hollow part of the end (right side in the figure) on the side of the fitting holes 132, and the fitting pawls 131 are fitted into the fitting holes 132 so as to be fixed.

The divided shim trays for the end parts, 11 are of two sorts. In one of the two sorts, one end is formed with a magnet fixation hole 133, and the other end is formed with fitting holes 132. In the other sort, one end is formed with a magnet fixation hole 133, and the other end is formed with fitting pawls 131. The shim trays for the end parts, 11 are arranged at both the ends of the combined shim tray 14. Here, when the superconducting magnet 21 is excited, large electromagnetic forces act on all the shim trays. Therefore, the whole combined shim tray 14 is screwed and fixed to the inside end parts of the superconducting magnet 21 by using the magnet fixation holes 133, thereby to prevent the shim trays from shifting and moving.

These constituents can be combined and detached as may be needed. The combined shim tray 14 is configured by combining the divided shim trays 12 and the shim tray spacers 13 in an appropriate array so that the magnetic material shims 101 may be located at desired positions.

The length of the shim tray spacer 13 is half of the full length of the divided shim tray 12. In the whole combined shim tray 14, the shim tray spacers 13 are used in the number of 2n (n=1, 2, ..., or 10), and the number of the divided shim trays 12 is decreased n (n=1, 2, ..., or 10), whereby the length of the whole combined shim tray 14 is held constant.

By the way, in this embodiment, the fitting structures are utilized for the connections and fixations between the constituents of the combined shim tray 14, but the same functional effects are achieved even by screwing or another fixation method. Besides, in this embodiment, the shim trays 11 are arranged at the end parts of the combined shim tray 14. However, even when the spacers 13 are attached to the end parts, the same functional effects are achieved as long as they can be fixed to the superconducting magnet 21.

There will be described the adjustments of a magnetic field uniformity in Embodiment 1 of this invention.

Initially, the superconducting magnet 21 is excited in a state where the combined shim tray 14 is not mounted, and the magnetic fields of the uniform magnetic field space 23 are measured at a large number of points, so as to evaluate the uniformity of a magnetic field which the superconducting magnet 21 generates. The uniformity of the magnetic field is decomposed into individual components by employing the Legendre function expansion indicated in Formula (1).

Subsequently, the arrangements of the magnetic material shims 101 for correcting the uniformity of the magnetic field are studied. In the arrangements of the magnetic material shims 101, the arrangements and quantities of the magnetic material shims 101 are determined so that the error components decomposed into the respective components may be made small, thereby to enhance the magnetic field uniformity. When the quantities of the magnetic material shims 101 become excessively large, there occur such drawbacks that the magnetic field uniformity changes depending upon an ambient temperature, and that the errors of the designed computational values of magnetic material shim outputs cumulate, so the magnetic field uniformity is difficult of enhancement. Accordingly, the quantities of the magnetic material shims 101 should preferably be as small as possible. In the design here, therefore, those arrangements of the magnetic material shims 101 with which the total quantity of the magnetic material shims 101 becomes small to the utmost, and which satisfy the restrictive condition of the total output value of the individual error components are obtained by an optimization computation.

Figure 4:
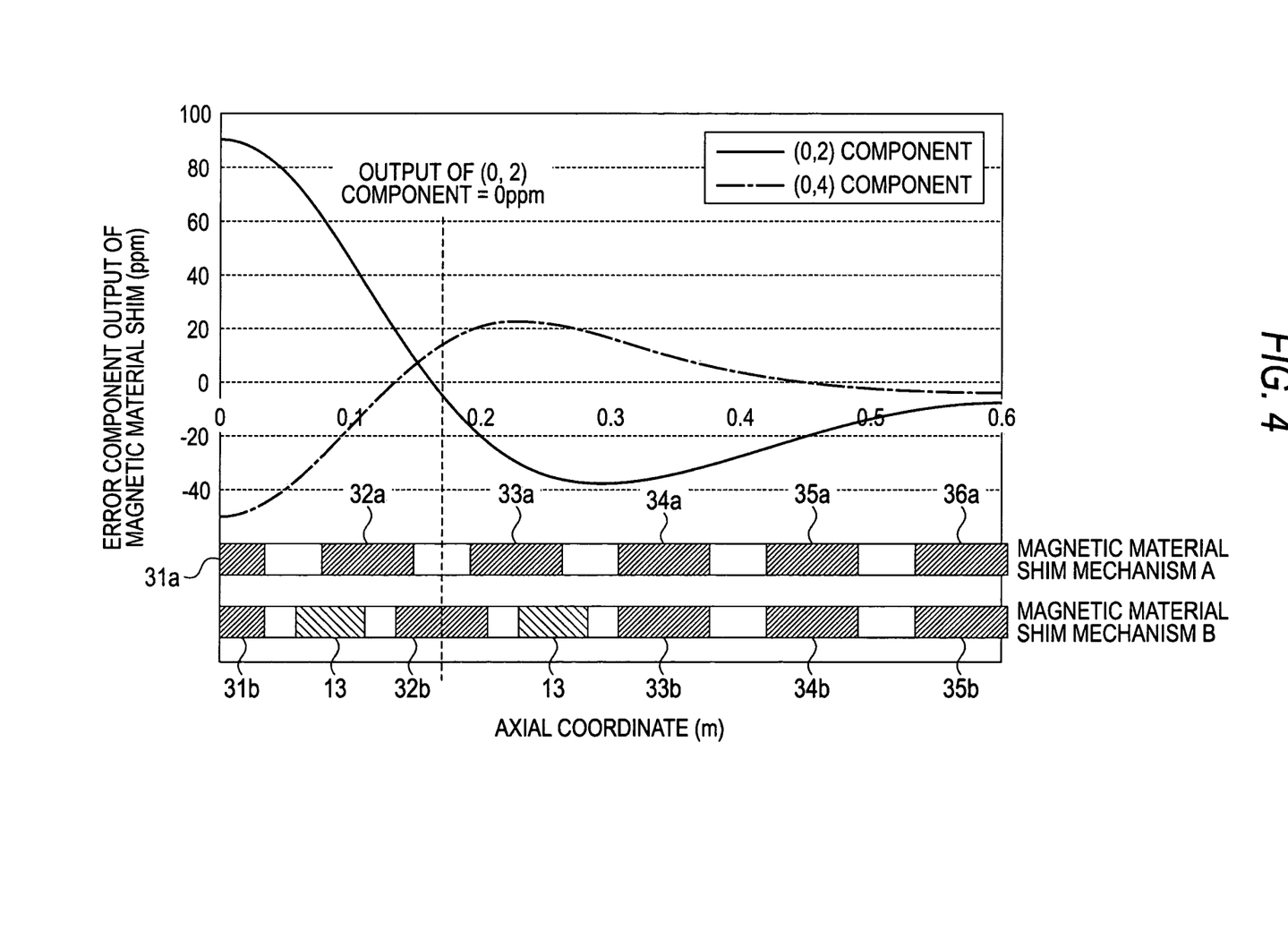
FIG. 4 is a diagram showing the output graph of magnetic material shims and the arrangement range of the magnetic material shims in Embodiment 1 of this invention.

The individual error components of magnetic fields which the magnetic material shims 101 generate depend upon the positions of the magnetic material shims 101. FIG. 4 is a graph showing how a (0, 2) error component and a (0, 4) error component generated by the magnetic material shims 101 in accordance with axial positions change in a case where the magnetic material shims 101 are mounted in axial symmetry on the inside cylinder of the superconducting magnet 21, having a radius of 0.45 m. Also, the arrangement ranges of a prior-art magnetic material shim mechanism A having shim pockets 31a-36a and a magnetic material shim mechanism B in Embodiment 1, having shim pockets 31b-35b are superposedly shown in the graph.

In a case, for example, where the superconducting magnet 21 generates the (0, 2) error component in a large quantity on a minus side and where this error component is to be corrected, the error output of the superconducting magnet 21 is canceled in such a way that the magnetic material shims 101 are arranged in the axial symmetry within a range of and below 0.15 m in terms of a Z-coordinate, whereby the magnetic material shims 101 generate the pertinent component on a plus side. Besides, in a case where the superconducting magnet 21 generates the (0, 4) error component in a large quantity on the plus side and where this error component is to be corrected, the error output of the superconducting magnet 21 is canceled in such a way that the magnetic material shims 101 are arranged in the axial symmetry within a range of and below 0.14 m in terms of the Z-coordinate, whereby the magnetic material shims 101 generate the pertinent component on the minus side.

In order to correct both the (0, 2) and (0, 4) components by the actual magnetic-material shim arrangements, the magnetic material shims 101 are arranged in large quantities in the shim pockets whose axial coordinates are nearest to zero (the shim pockets 31a and 31b), in both the magnetic material shim mechanisms A and B in FIG. 4.

In the shimming of the superconducting magnet 21 according to this embodiment, the magnetic material shim arrangements which make the error outputs and the used quantity of the magnetic material as small as possible are derived by the optimization computation in the above way, as to the components of $m \leqq 12$ and $n \leqq 16$ among the (m, n) error components.

With the prior-art magnetic material shim mechanisms A, however, the solution of the arrangements which cancel all the error components of $m \leqq 12$ and $n \leqq 16$ cannot be obtained, or even when the solution has been obtained, the quantities of the required magnetic material shims 101 become very large in some cases. By way of example, in a case where, on the occasion of FIG. 4, the (0, 2) component of the superconducting electromagnet 21 is substantially zero, while the (0, 4) component is outputted on the minus side, the output of the (0, 2) component of the magnetic material shims 101 needs to be zero, while the output of the (0, 4) component thereof needs to be on the plus side. At this time, with the shimming which employs the prior-art magnetic material shim mechanisms A, the (0, 2) and (0, 4) components are outputted just in the opposite directions whichever of the shim pockets 31a-36a the magnetic material shims may be arranged in, and it is therefore difficult to obtain the shim arrangements which cancel both the components.

In Embodiment 1 of this invention, therefore, the shim tray spacers 13 are inserted between the divided shim trays 12 of the combined shim tray 14, thereby to finely adjust the arrangement range of the magnetic material shims 101. According to the magnetic material shim mechanism B thus combined, the magnetic material shims 101 are arranged in a large quantity in the shim pocket 32b, thereby to make the output of the (0, 2) component zero and to generate the output of the (0, 4) component on the plus side. It is accordingly permitted to cancel the errors generated by the superconducting magnet 21.

The magnetic material shims 101 in the arrangement optimally designed in the above way are attached to the superconducting magnet 21, this superconducting magnet 21 is excited, and the magnetic fields of the uniform magnetic field space 23 are measured again, so as to reevaluate the uniformity of the magnetic field after the magnetic material shim corrections. Usually, it is difficult to bring the magnetic field uniformity into a target range, by one time of execution. Therefore, the operations are repeated several times so as to gradually enhance the magnetic field uniformity.

In this manner, the magnetic field adjustment device according to Embodiment 1 of this invention is a magnetic field adjustment device for a superconducting magnet wherein magnetic material shim mechanisms are arranged in the axial direction of the inside periphery of the cylindrical superconducting magnet, in which each of the magnetic material shim mechanisms includes a combined shim tray that is configured by rectilinearly coupling a plurality of divided shim trays and shim tray spacers inserted between the divided shim trays, and in which magnetic material shims for magnetic field adjustments are accommodated in the divided shim trays, whereby the versatility of the axial positions of the magnetic material shims can be heightened, and the correctable range of a magnetic field uniformity based on the passive shimming method can be widened.

Thus, the magnetic field uniformity can be heightened by magnetic material shim corrections, even for the magnet whose working precision is inferior and whose manufacturing dimensional errors are large, and the magnetic field uniformity can be heightened more, for the magnet whose working precision is high and whose rough field is highly uniform.

Besides, magnetic field uniformities can be adjusted using the same magnetic material shim mechanisms, for a plurality of types of magnets which exhibit different rough magnetic field characteristics.

Incidentally, according to Embodiment 1, the fixation between the magnetic material shim mechanism 28 and the superconducting magnet 21 is done by the screwing, and the fixation method of the combined shim tray 14 is based on the fitting structure. However, the fixations may well be based on the screwing, the fitting structure or any other fixation method as long as they can prevent the magnetic material shim mechanisms 28 from shifting and moving due to the electromagnetic forces which act on the magnetic material shims 101.

Besides, in Embodiment 1, the length of the shim tray spacer 13 is set at ½ of the length of the divided shim tray 11, and the divided shim trays 11 are removed in the number of n (n being an integer) when the shim tray spacers 13 are inserted in the number of 2n. However, the ratio of the lengths may be any other than ½.

Embodiment 2

Figure 5:
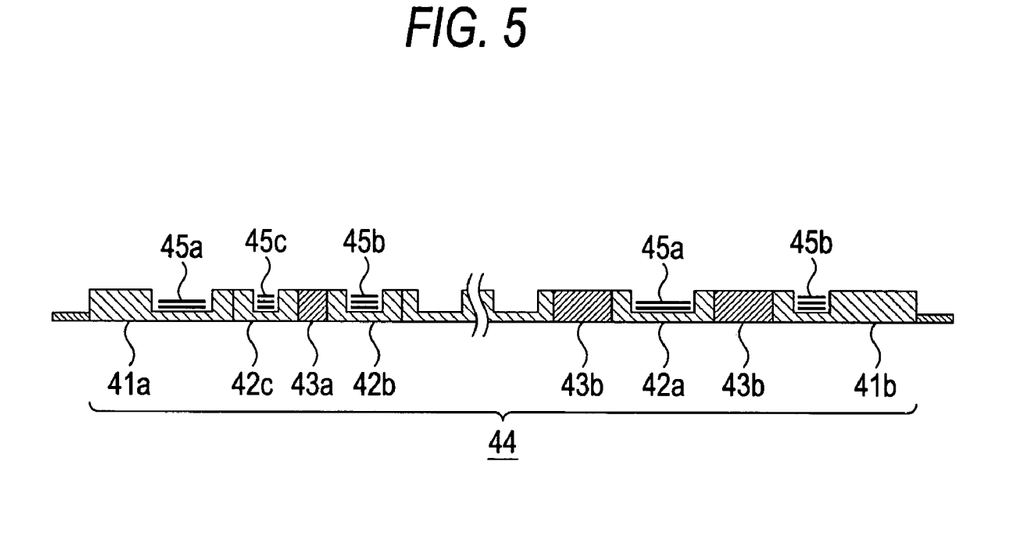
FIG. 5 is a sectional view of a magnetic material shim mechanism in Embodiment 2 of this invention.

FIG. 5 is a sectional view of a combined shim tray 44 showing Embodiment 2 of this invention.

The combined shim tray 44 in Embodiment 2 is so configured that a plurality of sorts having different axial length dimensions are prepared as divided shim trays for end parts, 41a and 41b, divided shim trays 42a-42c, and shim tray spacers 43a and 43b, respectively, and that magnetic material shims 45a-45c of dimensions conforming to the divided shim trays are set. The constituents of Embodiment 2 except the combined shim tray 44 and the magnetic material shims 45a-45c are the same as in Embodiment 1.

In Embodiment 1 described before, the dimensions of each of the divided shim tray for the end part, 11, the divided shim tray 12, and the shim tray spacer 13 have been of one sort, whereas in Embodiment 2 here, the dimensional sorts of the divided shim trays and the shim tray spacers are increased, and the magnetic material shims are optimized by selecting the shim trays in a combination in which the shimming is performed most easily.

Thus, the versatility of the axial positions of the magnetic material shims can be heightened still more than in Embodiment 1, and the correctable range of a magnetic field uniformity based on the passive shimming method can be widened more.

Embodiment 3

Figure 6:
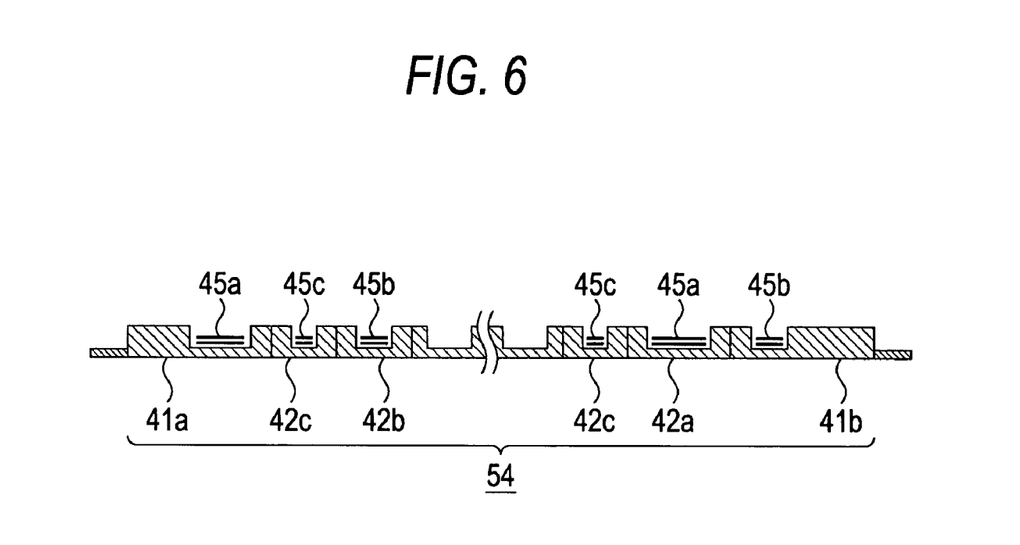
FIG. 6 is a sectional view of a magnetic material shim mechanism in Embodiment 3 of this invention.

FIG. 6 is a sectional view of a combined shim tray 54 showing Embodiment 3 of this invention.

The combined shim tray 54 in Embodiment 3 is so configured that a plurality of sorts having different axial length dimensions are prepared as divided shim trays for end parts, 41*a* and 41*b*, and divided shim trays 42*a*-42*c*, respectively, and that magnetic material shims 45*a*-45*c* of dimensions conforming to the divided shim trays are set. The constituents of Embodiment 3 except the combined shim tray 54 and the magnetic material shims 45*a*-45*c* are the same as in Embodiments 1 and 2, but Embodiment 3 differs from Embodiments 1 and 2 in the point that any spacer is not used.

In Embodiment 3, the divided shim trays for the end parts, 41*a* and 41*b* and the divided shim trays 42*a*-42*c* in the several sorts are combined, and the magnetic material shims are optimized by selecting the shim trays in a combination in which the shimming is performed most easily.

Thus, the versatility of the axial positions of the magnetic material shims can be heightened more, and the correctable range of a magnetic field uniformity based on the passive shimming method can be widened more. Moreover, since the number of components becomes smaller in correspondence with the shim tray spacers than in Embodiments 1 and 2, the efficiency of actual operations is enhanced.

Embodiment 4

Figure 7:
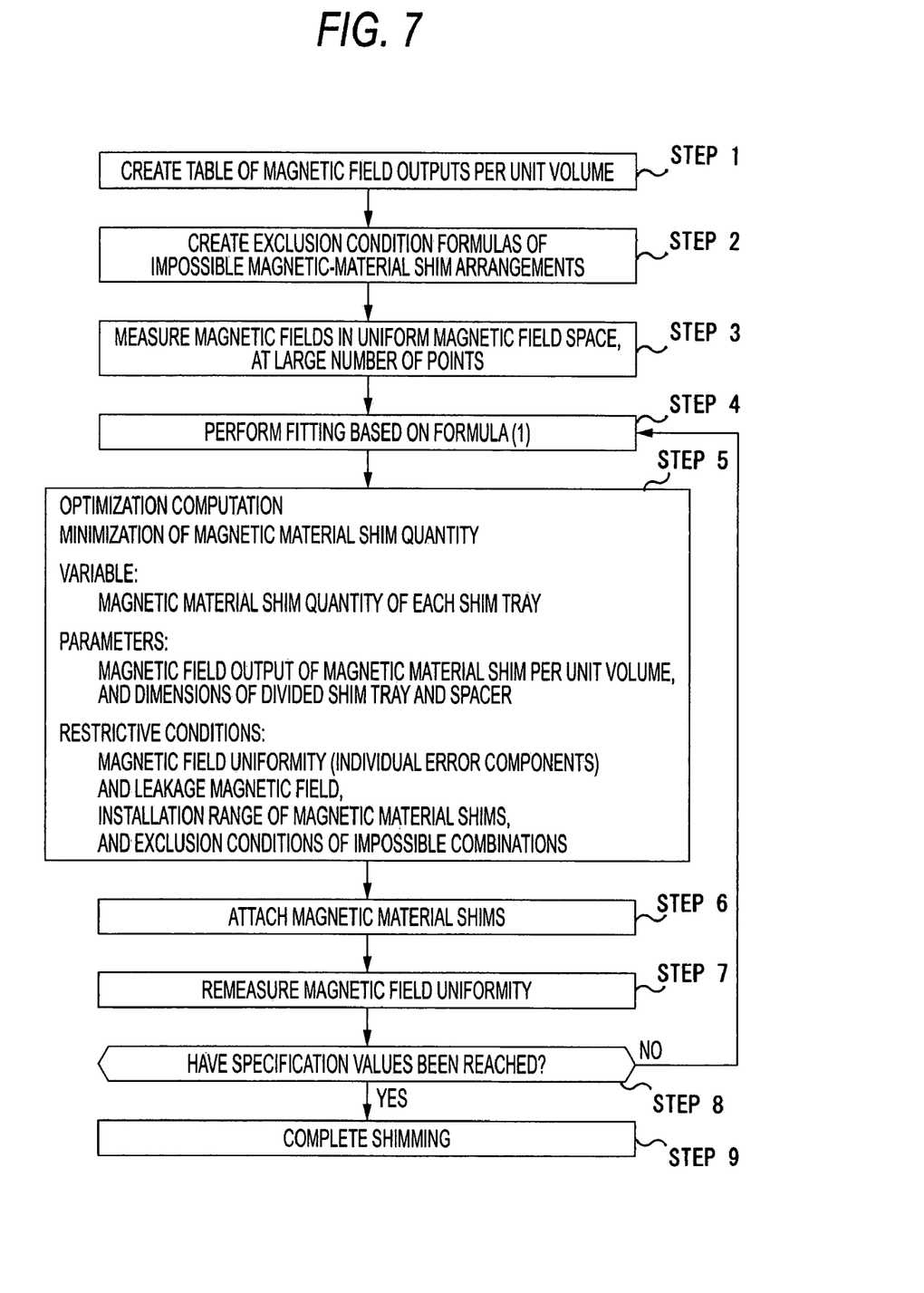
FIG. 7 is a flow chart of shimming in Embodiment 4 of this invention.

FIG. 7 is a flow chart showing Embodiment 4 of this invention.

In Embodiment 1, 2 or 3 described above, one combination of the combined shim tray 14, 44 or 54 is determined, whereupon the arrangements of the magnetic material shims in the individual shim pockets are computed for the optimization. Since, however, the combined shim tray consists of the large number of components, the number of combinations becomes enormous, and it is difficult to make studies comprehending all the combinations. In a case, for example, where a combined shim tray having an axial length of 1200 mm is to be configured by combining divided shim trays each of which has an axial dimension of 120 mm, with shim tray spacers each of which has an axial dimension of 60 mm, the number of combinations considered is as large as 10945. It is, in fact, impossible to manually execute the magnetic-material shim design computations in all the combinations, and even loop computations by a computer are not practicable because a long time is required. In each of Embodiments 1 to 3, therefore, several combinations in which a shimming solution is easily found out are picked out on the basis of experiences and actual results in the past, and only the quantities of the arrangements of the magnetic material shims for the individual shim pockets are computed. With this method, however, the combination of the shim trays has not been optimized, and hence, the magnetic material shim arrangements are not the most efficient ones in a strict sense.

Figure 8:
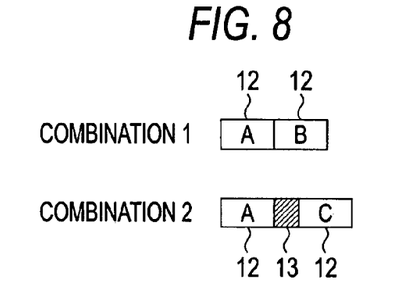
FIG. 8 is a diagram for explaining the restrictive condition of combinations in Embodiment 4 of this invention.

In this embodiment, therefore, it is assumed that the magnetic material shims can be arranged at all the magnetic-material shim arrangement positions considered. On that occasion, the installation range of the magnetic material shims and the exclusion conditions of impossible combinations are imposed as restrictive conditions, whereby the combination of the shim trays and the quantities of the magnetic material shims in the individual shim pockets are simultaneously optimized by one time of optimization computation, so as to correct the magnetic field uniformity. Concretely, the corrections of the magnetic field uniformity in this embodiment are made by the following steps as indicated in FIG. 7:

1. When the divided shim trays and the shim tray spacers to be used have been determined, a table of magnetic field outputs per unit volume is created beforehand, regarding the positions of the shim pockets as are possible in all the combinations of the combined shim tray.
2. The restrictive conditions which exclude the impossible impossible combinations are set on the basis of the dimensions of the divided shim trays and shim tray spacers which are to be used. In FIG. 8, for example, the magnetic material shims can be arranged simultaneously at positions A and B or positions A and C, but they cannot be arranged simultaneously at both the positions B and C. This fact can be formularized as Formula (2) given below. "$X_A$", "$X_B$" and "$X_C$" in Formula (2) denote the quantities of the magnetic material shims which are respectively arranged at the positions A, B and C. Such formularizations are previously set for all the combinations considered.

$$X_A \times X_B \geq 0$$

$$X_A \times X_C \geq 0$$

$$X_B \times X_C = 0 \qquad (2)$$

Step 3. Magnetic fields in the uniform magnetic field space are measured at a large number of points.

Step 4. Fitting is performed in conformity with Formula (1), and individual error components are obtained.

Step 5. An optimization computation is executed with mathematical programming such as linear programming, under the following conditions:

Target of optimization: Minimization of magnetic material shim quantity

Figure 9:
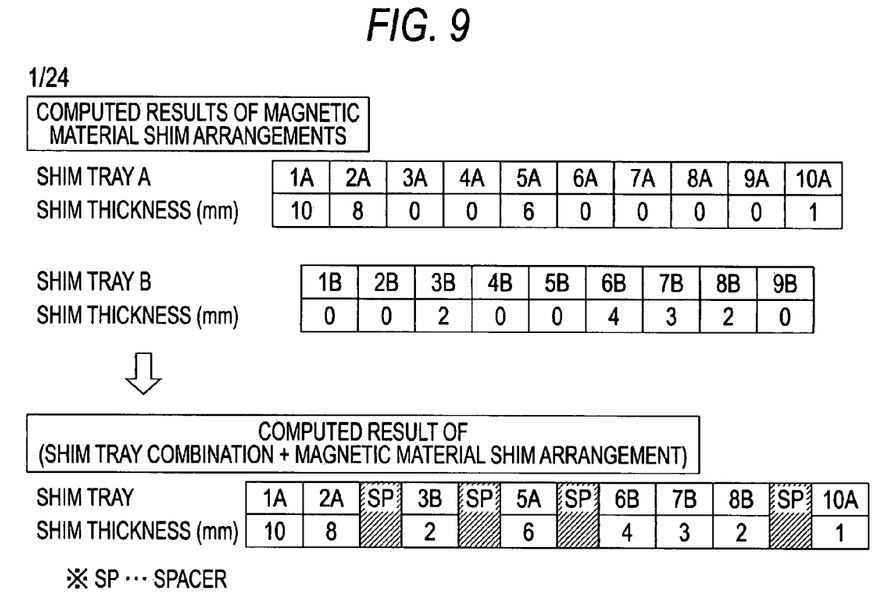
FIG. 9 is an explanatory diagram showing examples of shim tray combinations and magnetic material shim arrangements which are based on the results of an optimization computation in Embodiment 4 of this invention.

Variable to be optimized: Magnetic material shim quantity which is mounted in each shim pocket Parameters of optimization: (1) Magnetic field output of magnetic material shim per unit volume, and (2) Dimensions of divided shim tray and shim tray spacer Restrictive conditions: (1) Magnetic field uniformity (individual error components) and leakage magnetic field, (2) installation range of magnetic material shims, and (3) exclusion conditions of impossible combinations As the results of the optimization computation, shim tray combinations and magnetic material shim arrangements are outputted as shown in FIG. 9 by way of example. FIG. 9 concerns one set of magnetic material shim mechanisms. In actuality, the computed results of similar shim tray combinations and magnetic material shim arrangements are outputted for all the 24 sets of magnetic material shim mechanisms which are mounted on one superconducting magnet 21.

Step 6. The shim trays are assembled and arranged in accordance with the results of FIG. 9.

Step 7. The magnetic field uniformity is remeasured.

Step 8. The remeasured value of the magnetic field uniformity is compared with specification values. If the magnetic field uniformity does not satisfies the specification values, the routine is returned to the step 4 so as to make the magnetic field uniformity adjustment again.

Step 9. If the magnetic field uniformity satisfies the specification values, the shiming is ended.

By the way, in order to shorten a job time period and to ensure the reproducibility of the positions of the magnetic material shims, it is sometimes the case that, in attaching the magnetic material shims in the second time of shimming, et seq., only the arrangement quantities of the magnetic material shims are altered with the shim tray combinations in the first time of shimming used as they are. Besides, in order to shorten the job time period, all the 24 sets of magnetic material shim mechanisms are set as having the same configurations.

Not only the arrangements of the magnetic material shims, but also the combined shim tray is optimized by tracing such steps, whereby the enormous number of combinations of the shim trays can be comprehended in the optimization computation, and the enlargement of the correctable range of the magnetic field uniformity based on the passive shimming method and the shortening of the shimming design time period can be attained.

Embodiment 5

Figure 10:
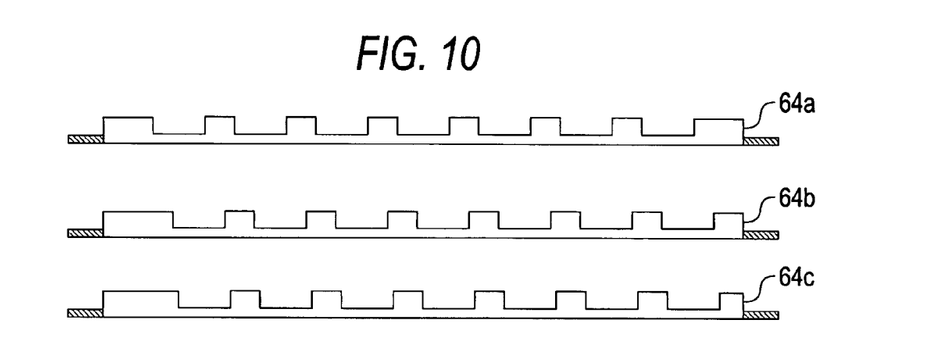
FIG. 10 is a sectional view showing magnetic material shim mechanisms in Embodiment 5 of this invention.

FIG. 10 is a sectional view showing shim trays 64a-64c in Embodiment 5 of this invention.

Each of the shim trays 64a-64c in Embodiment 5 is a molded article having a unitary structure likewise to the prior-art type. The three sorts of shim trays differ in the axial positions of shim pockets from one another.

In each of Embodiments 1-4 described before, one shim tray is configured by combining the three sorts of components; the divided shim trays for the end parts, the divided shim trays, and the shim tray spacers. In contrast, according to Embodiment 5, the plurality of sorts of shim trays molded unitarily are prepared as shown in FIG. 10, and an optimization computation is executed, including which of the unitary type shim trays is to be used.

Referring to FIG. 10, the shim tray 64a is the prior-art shim tray. The ⅓-shifted shim tray 64b is a shim tray in which the magnetic-material-shim mounting positions of the prior-art shim tray are shifted ⅓ of the width of each magnetic material shim. Likewise, the ½-shifted shim tray 64c is a shim tray in which the magnetic-material-shim mounting positions are shifted ½ of the width of each magnetic material shim.

In optimizing the magnetic material shims, which of the shim trays is to be used is included among the variables of the optimization, whereby the versatility of the axial positions of the magnetic material shims can be heightened still more, and the correctable range of a magnetic field uniformity based on the passive shimming method can be widened more. Moreover, as compared with Embodiments 1-4, Embodiment 5 need not combine and fabricate the shim tray and can shorten the job time period of shimming. Incidentally, only the arrangements of the magnetic material shims may well be optimized using a predetermined shim tray, without optimizing the shim tray which is to be used.

Embodiment 6

Figure 11:
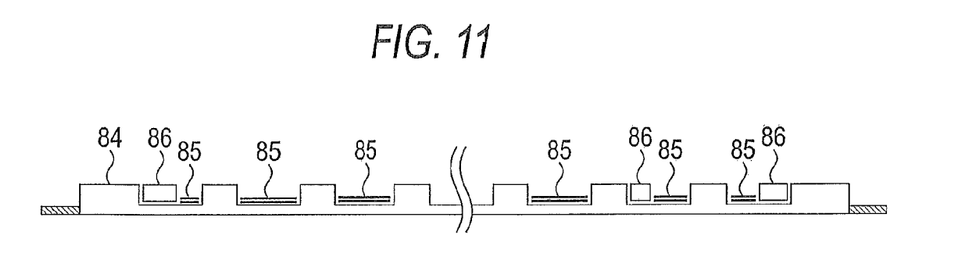
FIG. 11 is a sectional view of a magnetic material shim mechanism in Embodiment 6 of this invention.

FIG. 11 is a sectional view of a magnetic material shim mechanism showing Embodiment 6 of this invention. Referring to FIG. 11, numeral 84 designates a shim tray, numeral 85 magnetic material shims, and numeral 86 a spacer in a shim pocket. In this embodiment, the magnetic material shims 85 which are smaller than each shim pocket are used, and the spacers in the shim pockets, 86 are employed, whereby the magnetic material shims 85 are fixed at desired positions within the shim pockets.

Thus, the arrangements of the magnetic material shims can be set more finely than in the prior art, the versatility of the optimization of a shim design heightens, and the correctable range of a magnetic field uniformity based on the passive shimming method widens.

By the way, in this embodiment, the specified configuration is applied to the unitary type shim tray, but the same functional effects are attained even when the configuration is applied to any of the combined shim trays and the unitary molding type shim trays shown in Embodiments 1-3 and 5.

Embodiment 7

Figure 12:
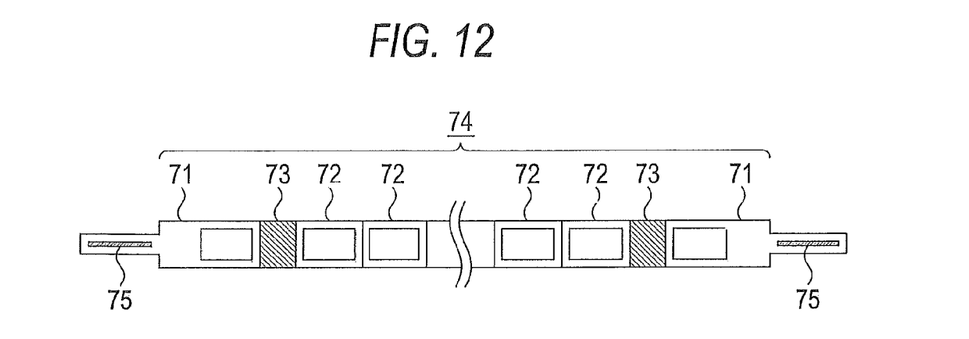
FIG. 12 is a top plan view of a magnetic material shim mechanism in Embodiment 7 of this invention.

FIG. 12 is a top plan view of a combined shim tray 74 showing Embodiment 7 of this invention.

Embodiment 7 has as its feature, that the combined shim tray 74 is assembled using divided shim trays for end parts, 71 shown in FIG. 12. In Embodiments 1-4 described before, for the purpose of fixing the magnetic material shim mechanism to the superconducting magnet, the lengths of the spacer and the divided shim tray which are to be combined need to be regulated so that the full length of the magnetic material shim mechanism may become equal to the length of amounting mechanism on the side of the superconducting magnet. In contrast, according to Embodiment 7, a magnetic material shim mechanism does not require such a regulation.

Now, the magnetic material shim mechanism in this embodiment will be described with reference to FIG. 12. Referring to FIG. 12, the combined shim tray 74 is configured by rectilinearly connecting the divided shim trays for the end parts, 71, divided shim trays 72, and shim tray spacers 73. In the foregoing embodiments, the end parts of the magnetic material shim mechanism are respectively provided with round screw holes for fixing the whole magnetic-material shim mechanism to the superconducting magnet, whereas in this embodiment, such screw holes are slots 75 with which the mounting positions of the magnetic material shim mechanism in the lengthwise direction thereof can be adjusted. Therefore, the magnetic material shim mechanism can be mounted on the superconducting magnet even when its full length has fluctuated within a range of ±50 mm.

Thus, it is possible to sharply loosen the restriction that the full length of the magnetic material shim mechanism must be held constant, and the axial positions of magnetic material shims can be continuously changed. Accordingly, the versatility of the optimization of a shim design heightens, and the correctable range of a magnetic field uniformity based on the passive shimming method widens.

By the way, in this embodiment, the lengths of the shim pockets of the divided shim trays for the end parts, 71 and the divided shim trays 72 are all equal, but the divided shim trays whose shim pockets have the different lengths may well be adopted as in Embodiments 1-3, or the specified configuration may well be applied to the shim trays of the unitarily molded articles as in Embodiments 5 and 6.

Various modifications and alterations of this invention will be apparent to those skilled in the art without departing from the scope and spirit of this invention, and it should be understood that this invention is not limited to the illustrative embodiments set forth herein.

What is claimed is:

1. A magnetic field adjustment device for a superconducting magnet having a substantially cylindrical share, the magnetic field adjustment device comprising:

magnetic material shim mechanisms arranged in an axial direction of an inside periphery of the superconducting magnet;

wherein each of the magnetic material shim mechanisms comprises:

a combined shim tray including a plurality of divided shim trays divided in the axial direction, and at least one shim tray spacer inserted between the divided shim trays such that the plurality of divided shim trays and the at least one shim tray spacer are rectilinearly coupled in the axial direction, the plurality of divided shim trays including a first type of shim trays having a first connection mechanism, and a second type of shim trays having a second connection mechanism different from the first connection mechanism of said first type of shim trays; and magnetic material shims accommodated in the divided shim trays for adjustment of a magnetic field.

2. The magnetic field adjustment device for a superconducting magnet as defined in claim 1, wherein said combined shim tray comprises a plurality of divided shim trays and shim tray spacers of different axial lengths.

3. The magnetic field adjustment device for a superconducting magnet as defined in claim 1, wherein said first type of divided shim trays are of different axial lengths than said second type of divided shim trays.

4. The magnetic field adjustment device for a superconducting magnet as defined in claim 1, wherein said first type of shim trays of said combined shim tray include divided shim trays for end parts whose mounting positions are configured to be adjustable in a lengthwise direction.

5. An MRI equipment comprising a magnetic field adjustment device for a superconducting magnet as defined in claim 1.

6. The magnetic field adjustment device for a superconducting magnet as defined in claim 1, wherein said combined shim tray comprises a different number of said first type of shim trays than said second type of shim trays.

7. The magnetic field adjustment device for a superconducting magnet as defined in claim 1, wherein the second connection mechanism of said second type of shim trays is configured to connect at least two of said second type of shim trays directly to each other.

8. The magnetic field adjustment device for a superconducting magnet as defined in claim 1, wherein the first connection mechanism of said first type of shim trays is configured to connect said first type of shim trays to said second type of shim trays.

* * * * *